United States Patent
Foong et al.

(10) Patent No.: US 8,860,212 B1
(45) Date of Patent: Oct. 14, 2014

(54) FLUID COOLED SEMICONDUCTOR DIE PACKAGE

(71) Applicants: Chee Seng Foong, Sg Buloh (MY); Tim V. Pham, Austin, TX (US)

(72) Inventors: Chee Seng Foong, Sg Buloh (MY); Tim V. Pham, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/862,473

(22) Filed: Apr. 15, 2013

(51) Int. Cl.
  *H05K 7/20* (2006.01)
  *H01L 23/473* (2006.01)
  *H01L 21/50* (2006.01)

(52) U.S. Cl.
  CPC ............ *H01L 23/473* (2013.01); *H01L 21/50* (2013.01)
  USPC ....... 257/714; 257/98; 257/E23.088; 361/699

(58) Field of Classification Search
  CPC ...... H01L 23/34; H01L 23/427; H01L 23/473
  USPC ............ 257/714, E23.088, E23.098; 361/699
  See application file for complete search history.

(56) References Cited

U.S. PATENT DOCUMENTS

| | | | |
|---|---|---|---|
| 7,266,267 B2 | 9/2007 | Bakir | |
| 7,289,326 B2 | 10/2007 | Heydari | |
| 7,928,563 B2 | 4/2011 | Bakir | |
| 8,159,065 B2 * | 4/2012 | Suh et al. | 257/712 |
| 8,563,365 B2 * | 10/2013 | King et al. | 438/122 |
| 2009/0057881 A1 * | 3/2009 | Arana et al. | 257/714 |
| 2010/0187682 A1 * | 7/2010 | Pinjala et al. | 257/713 |

* cited by examiner

*Primary Examiner* — John C Ingham
(74) *Attorney, Agent, or Firm* — Charles Bergere

(57) ABSTRACT

A fluid cooled semiconductor die package includes a package support substrate with a die mounting surface and an opposite package mounting surface. The package support substrate has external connector solder deposits on respective external connector pads of the package mounting surface, and a package fluid inlet duct and a package fluid outlet duct each providing fluid communication between the die mounting surface and package mounting surface. A semiconductor die is mounted on the die mounting surface. The die has external terminals electrically connected to the external connector pads. An inlet solder deposit is soldered to an inlet pad of the package mounting surface. The inlet pad surrounds an entrance of the fluid inlet duct. An outlet solder deposit is soldered to an outlet pad of the package mounting surface. The outlet pad surrounds an exit of the package fluid inlet duct.

18 Claims, 6 Drawing Sheets

FLUID COOLED SEMICONDUCTOR DIE PACKAGE

BACKGROUND OF THE INVENTION

The present invention relates to integrated circuit packaging and, more particularly, to a fluid cooled semiconductor die package.

Electronic devices, such as integrated circuits or semiconductor die packages, generate heat during operation. Such packages are commonly cooled to ensure proper functioning and to enable higher operating speeds. A basic package cooling system may promote convective cooling using a fan that directs forced air to flow over the package's outer surface. In addition, a heat sink (e.g., a metal body having a substantially flat contact surface and a plurality of projections or fins) may be placed in thermal contact with the package. During operation, heat is conducted away from the package and into the projections, which are convectively cooled.

Although fairly reliable and inexpensive to implement, convection cooling systems of the type described above are not always adequate especially for packages that consume relatively large currents. For this reason, refrigeration systems and piped fluid coolant systems have been developed for cooling semiconductor packages. These refrigeration systems and piped fluid coolant systems often continually supply a refrigerant or liquid coolant flow through the package by use of conduits, with the connections between the conduits being hermetically sealed by small relatively expensive hermetically sealable couplings.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
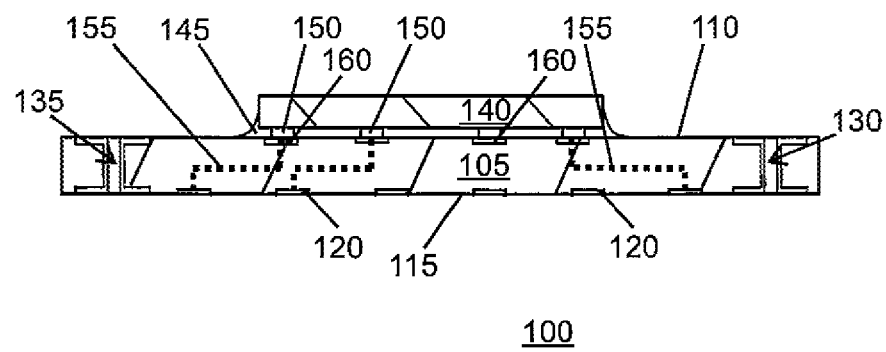
FIG. 1 is a cross-sectional side view of a substrate and die assembly, in accordance with a first preferred embodiment of the present invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides for a fluid cooled semiconductor die package comprising a package support substrate with a die mounting surface and an opposite package mounting surface. The package support substrate has external connector solder deposits soldered to respective external connector pads of the package mounting surface, and the package support substrate has at least one package fluid inlet duct and at least one package fluid outlet duct each providing fluid communication between the die mounting surface and package mounting surface. A semiconductor die is mounted on the die mounting surface of the package support substrate, and the semiconductor die has external terminals selectively electrically connected to the external connector pads. There is an inlet solder deposit soldered to an inlet pad of the package mounting surface, and the inlet pad surrounds an entrance of the package fluid inlet duct. There is also an outlet solder deposit soldered to an outlet pad of the package mounting surface, and the outlet pad surrounds an exit of the package fluid inlet duct.

In another embodiment, the present invention provides for a fluid cooled circuit board system comprising a circuit board with mounting pads thereon, the circuit board having a board inlet duct and board outlet duct. There is a package support substrate with a die mounting surface and an opposite package mounting surface, the package support substrate has external connector solder deposits coupling between respective external connector pads of the package mounting surface and the mounting pads of the circuit board. The package support substrate has at least one package fluid inlet duct and at least one package fluid outlet duct each providing fluid communication between the die mounting surface and package mounting surface. A semiconductor die is mounted on the die mounting surface of the package support substrate, and the semiconductor die has external terminals selectively electrically connected to the external connector pads. There is an inlet solder deposit coupling an inlet pad of the package mounting surface to an inlet pad of the circuit board. The inlet pad of the package mounting surface surrounds an entrance of the package fluid inlet duct and the inlet pad of the circuit board surrounds an exit of the board inlet duct. The inlet solder deposit has an inlet deposit aperture therein that provides a hermetic coupling between the board inlet duct and package fluid inlet duct. There is an outlet solder deposit coupling an outlet pad of the package mounting surface to an outlet pad of the circuit board. The outlet pad of the package mounting surface surrounds an exit of the package fluid outlet duct and an outlet pad of the circuit board surrounds an entrance of the board outlet duct. The outlet solder deposit has an outlet deposit aperture therein that provides a hermetic coupling between the board outlet duct and package fluid outlet duct.

In a further embodiment, the present invention provides for a method of manufacturing a fluid cooled semiconductor die package, the method includes providing a package support substrate with a die mounting surface with external connector pads and an opposite package mounting surface. The package support substrate has at least one package fluid inlet duct and at least one package fluid outlet duct each providing fluid communication between the die mounting surface and package mounting surface. The method performs a process of mounting a semiconductor die on the die mounting surface, and the semiconductor die has external terminals that are selectively electrically connected to the external connector pads. The method further performs a process of soldering external connector solder deposits to the external connector pads, an inlet solder deposit to an inlet pad that surrounds an entrance of the package fluid inlet duct, and an outlet solder deposit to an outlet pad that surrounds an exit of the package fluid inlet duct.

Referring now to FIG. 1, a cross-sectional side view of a substrate and die assembly 100 in accordance with a first preferred embodiment of the present invention is shown. The substrate and die assembly 100 has a package support substrate 105 with a die mounting surface 110 and an opposite package mounting surface 115. The package support substrate 105 has external connector pads 120 that are typically formed or deposited on or in the package mounting surface 115. The package support substrate 105 also has at least one package fluid inlet duct 130 and at least one package fluid outlet duct 135 each providing fluid communication between the die mounting surface 110 and package mounting surface 115. As will be apparent to a person skilled in the art, these ducts 130 and 135 are formed by drilling apertures in the package support substrate 105.

There is a semiconductor die 140 mounted (fixed) on the die mounting surface 110 and the semiconductor die 140 has external terminals 150 selectively electrically connected to the external connector pads 120. Connection of the external terminals 150 to the external connector pads 120 is by a conventional connector arrangement 155 (shown in phantom) that can include: mounting pads 160 and conductive vias; or mounting pads 160, runners and conductive vias. Such connector arrangements 155 are well known in the art and are therefore not described in detail. Also, it will be apparent that the semiconductor die 140 is mounted on the die mounting surface 110 by soldered joints that electrically interconnect aligned mounting pads 160 and external terminals 150 which are sealed by an epoxy resin 145 that also acts as a stress buffer.

Figure 2:
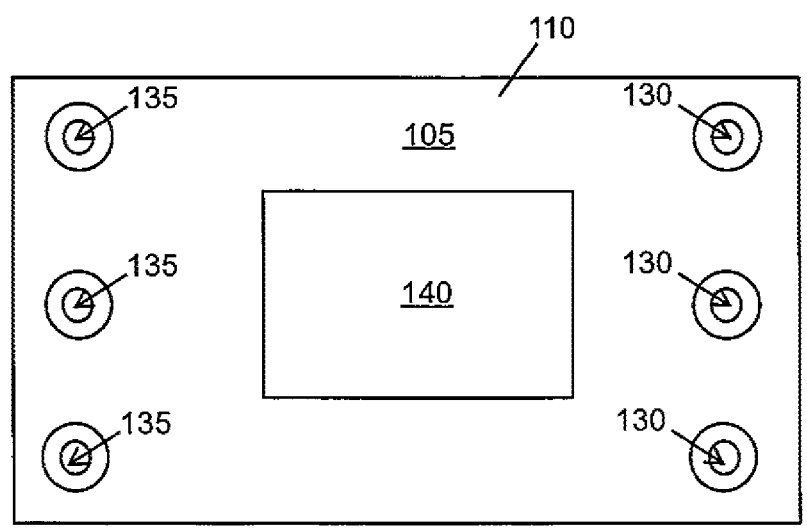
FIG. 2 is a top plan view of the substrate and die assembly of FIG. 1.

Referring to FIG. 2 there is illustrated a top plan view of the substrate and die assembly 100. As shown in this embodiment, there are three package fluid inlet ducts 130 and three package fluid outlet ducts 135. However, other numbers and configurations of ducts 130, 135 are possible as will be apparent to a person skilled in the art.

Figure 3:
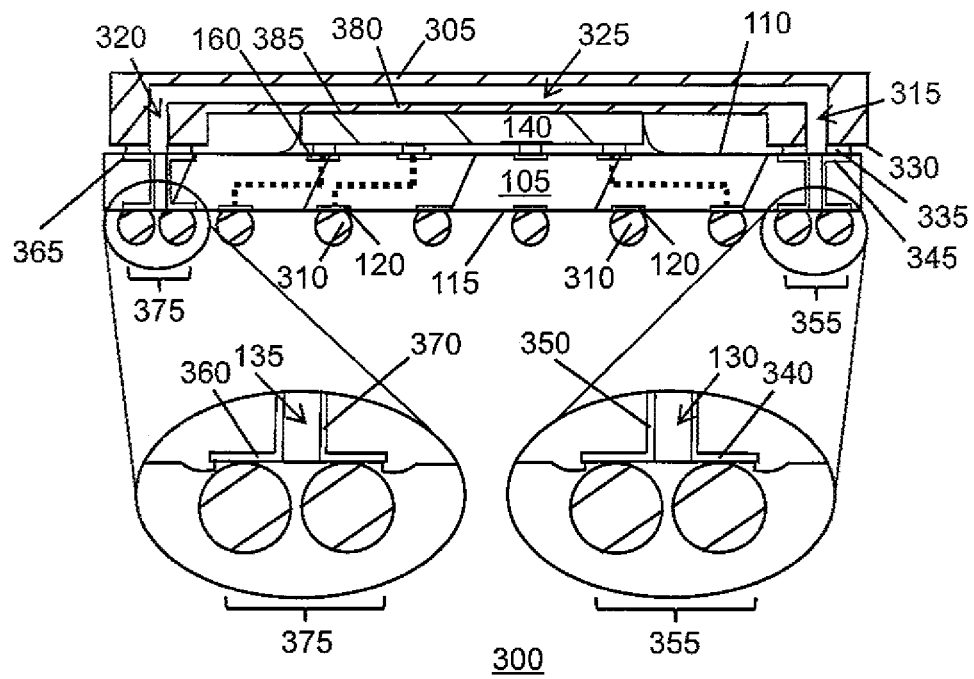
FIG. 3 is a cross-sectional side view of an assembled fluid cooled semiconductor die package, in accordance with a first preferred embodiment of the present invention.

Referring to FIG. 3 there is illustrated a cross-sectional side view of an assembled fluid cooled semiconductor die package 300, in accordance with a first preferred embodiment of the present invention. The assembled fluid cooled semiconductor die package 300 is the substrate and die assembly 100 with a heat transfer lid 305 mounted to the die mounting surface 110. The heat transfer lid 305 covers the semiconductor die 140 and in operation provides for fluid cooling of the die 140. There are also solder balls 310 held temporarily in place (by a flux paste) on respective external connector pads 120 of the package mounting surface 115. The heat transfer lid 305 has at least one lid inlet passage 315 in fluid communication with at least one lid outlet passage 320. The heat transfer lid 305 has a conduit that provides a heat transfer chamber 325 that provides for the fluid communication between the lid inlet passage 315 and the lid outlet passage 320. In this embodiment, a wall 380 of the heat transfer chamber 325 abuts a non-active surface 385 of the semiconductor die 140 thereby facilitating the possibility of improved heat transfer between the die 140 and chamber 325. To further improve heat transfer, a thin layer of Thermal Interface Material (TIM) can be sandwiched between the die 140 and wall 380.

A base 330 of the heat transfer lid 305 is fixed to the die mounting surface 110 by an epoxy 335. The epoxy 335 provides a hermetic seal and thus the lid inlet passage 315 is hermetically coupled to the package fluid inlet duct 130 and the lid outlet passage 135 is hermetically coupled to the package fluid outlet duct 135. Consequently, the heat transfer chamber 325 is hermetically coupled to the package fluid inlet duct 130 and package fluid outlet duct 135.

There is an inlet pad 340 in the package mounting surface 115 that surrounds an entrance of the package fluid inlet duct 130. A copper deposit, or any other metal-based deposit, forms the inlet pad 340 in the package mounting surface 115. This inlet pad 340 is an annulus and in this preferred embodiment there is also an annular inlet pad 345, in the die mounting surface 110, which is formed from a copper or other metal based deposit. Furthermore, an inner surface of the fluid inlet duct 130 is coated with a copper or other metal based deposit thereby forming a metallic inlet tube 350 coupling the inlet pad 340 to the annular inlet pad 345. A pair of solder balls 355 is deposited on the inlet pad 340 and the solder balls 355 are held temporarily in place by a flux paste. In another embodiment a single solder ball may be used instead of the pair of solder balls 355. In this regard, each of the solder balls 355, or the single solder ball, is the same size as the solder balls 310.

There is also an outlet pad 360 in the package mounting surface 115 that surrounds an exit of the package fluid outlet duct 135. A copper deposit, or any other metal-based deposit, forms the outlet pad 360 in the package mounting surface 115. This outlet pad 360 is an annulus and in this preferred embodiment there is also an annular outlet pad 365, in the die mounting surface 110, which is formed from a copper or other metal based deposit. Furthermore, an inner surface of the fluid outlet duct 130 is coated with a copper or other metal based deposit thereby forming a metallic outlet tube 370 coupling the outlet pad 360 to the annular outlet pad 365. A pair of solder balls 375 is deposited on the outlet pad 360 and the solder balls 375 are also held temporarily in place by a flux paste. In another embodiment a single solder ball may be used instead of the pair of solder balls 375. In this regard, each of the solder balls 375, or the single solder ball, is the same size as the solder balls 310. Also, as shown in the magnified illustrations of the inlet and outlet pads 340 and 360, a process of making the substrate 105 (by masking and depositing dielectric materials and metal conductors) causes a small mound to form around all the pads 120, 340 and 360. This mound causes the pads 120, 340 and 360 to be in a small recess which in some embodiments may assist in locating the solder balls 310, 355 and 375 on their respective pads 120, 340 and 360.

Figure 4:
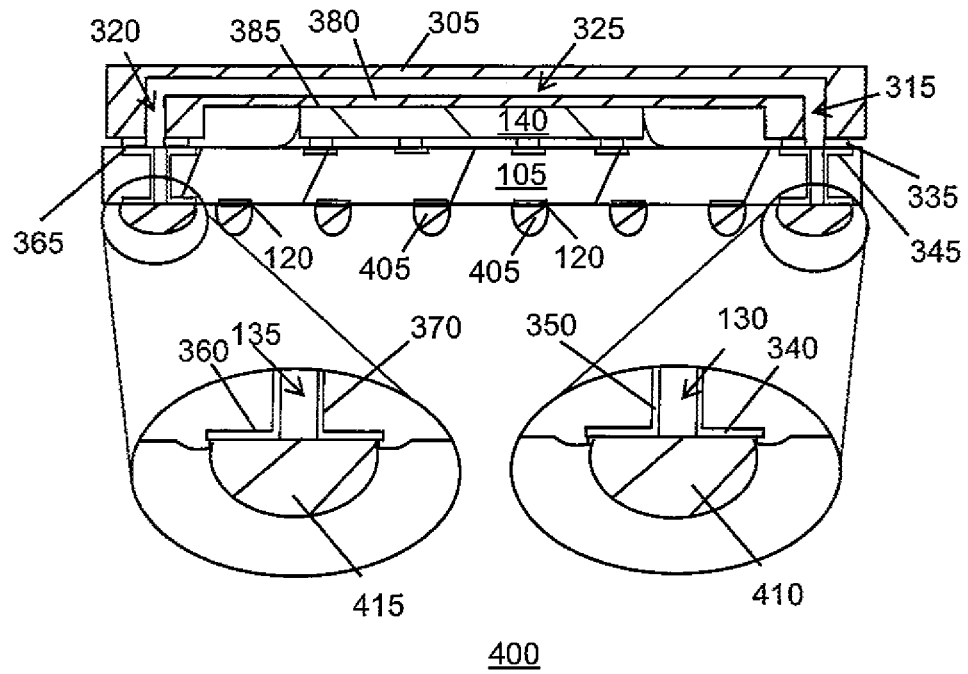
FIG. 4 is a cross-sectional side view of a fluid cooled semiconductor die package, in accordance with the first preferred embodiment of the present invention.

Referring to FIG. 4 there is illustrated a cross-sectional side view of a fluid cooled semiconductor die package 400, in accordance with the first preferred embodiment of the present invention. The fluid cooled semiconductor die package 400 is the assembled fluid cooled semiconductor die package 300 after a curing the epoxy and then performing a solder reflow process on the solder balls 310, 355 and 375. The die package 300 is heated in an oven to cure the epoxy 355 and therefore improve the robustness of the hermetic seal. In this specific embodiment the heat transfer lid 305 is made from thin sheet steel, however any thermally conductive material can be used. After curing the epoxy 355 a solder reflow process is performed in another oven in which the solder balls 310, 355 and 375 become soldered to their respective pads 120, 340 and 360.

The solder reflow process results in the solder balls 310 slightly changing shape and forming solder globules of external connector solder deposits 405 that are soldered to a respective external connector pad 120. Also, the solder balls 355 have changed shape and form inlet solder deposit or solder globule 410 that is soldered to the inlet pad 340. Similarly, the solder balls 375 have changed shape and form an outlet solder deposit or solder globule 415 that is soldered to the outlet pad 360. As illustrated, the globule 410 covers the entrance to the package fluid inlet duct 130. Similarly, the globule 415 covers the exit to the package fluid outlet duct 135.

Figure 5:
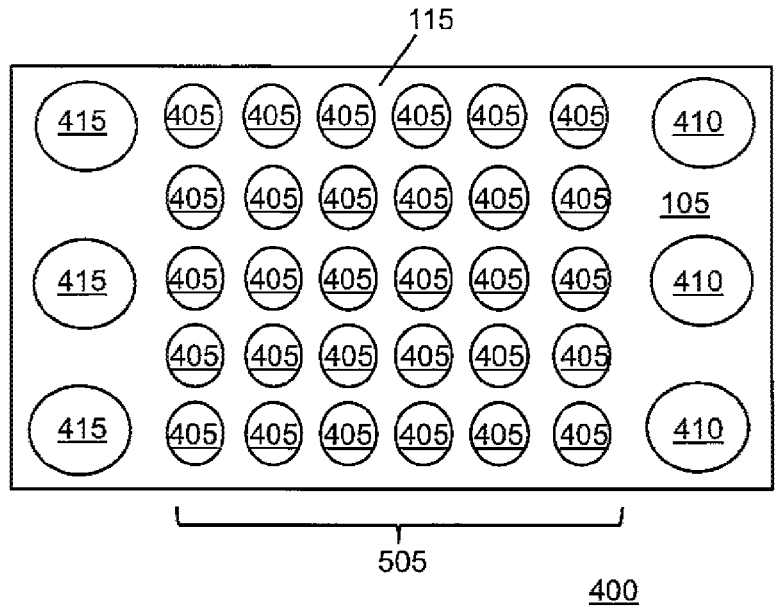
FIG. 5 is an underside plan view of the fluid cooled semiconductor die package of FIG. 4.

Referring to FIG. 5 there is illustrated an underside plan view of the fluid cooled semiconductor die package 400. As shown, the external connector solder deposits 405 form a ball grid array external connector arrangement 505. Also illustrated are the globules 410 that cover the entrance to their respective package fluid inlet ducts 130 and the globules 415 that cover the exit to their package fluid outlet ducts 135.

Figure 6:
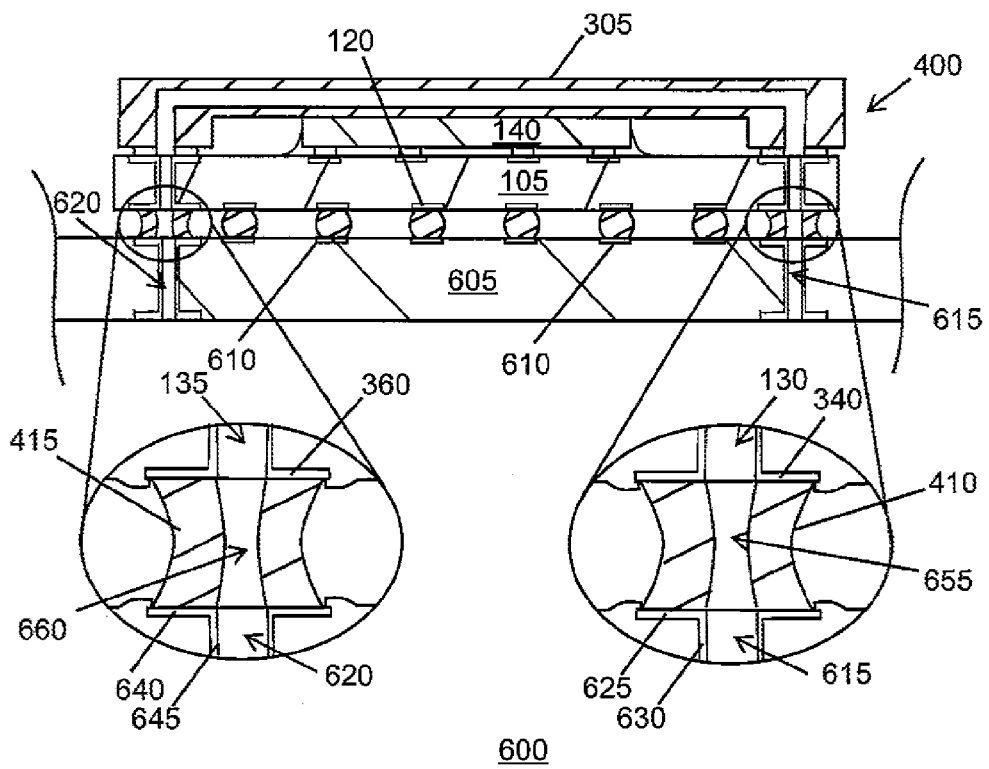
FIG. 6 is a cross-sectional side view of a fluid cooled circuit board system, in accordance with the first preferred embodiment of the present invention.

Referring to FIG. 6 there is illustrated cross-sectional side view of a fluid cooled circuit board system 600, in accordance with the first preferred embodiment of the present invention. The system 600 includes a circuit board 605 with mounting pads 610 on a surface of the circuit board 605. The circuit board 605 also has a board inlet duct 615 and a board outlet duct 620. There is a board inlet pad 625 that surrounds an exit of the board inlet duct 615. A copper deposit, or any other metal-based deposit, forms the board inlet pad 625. This board inlet pad 625 is an annulus that surrounds the exit of the board inlet duct 615. Also, an inner surface of the board inlet duct 615 is coated with a copper or other metal based deposit thereby forming a metallic tube 630 coupled to the board inlet pad 625.

There is also a board outlet pad 640 that surrounds an entrance of the board outlet duct 620. A copper deposit, or any other metal-based deposit, forms a board outlet pad 640. This board outlet pad 640 is an annulus that surrounds the entrance of the board outlet duct 620. Also, an inner surface of the board outlet duct 620 is coated with a copper or other metal based deposit thereby forming a metallic tube 645 coupled to the board outlet pad 640.

The system 600 also includes the fluid cooled semiconductor die package 400 mounted to the circuit board 605 and the package 400 has undergone a solder reflowing process so that the external connector solder deposits 405 provide a soldered interconnect between respective aligned external connector pads 120 and the mounting pads 610. As a result, the external connector solder deposits 405 provide a soldered coupling between respective external connector pads 120 and the mounting pads 610. Also, the inlet solder deposit 410 couples the inlet pad 340 to the board inlet pad 625. Similarly, the outlet solder deposit 415 couples the outlet pad 360 to the board outlet pad 640. As shown, the reflowing process has caused the solder deposits 410, 415 to change shape and results in an inlet deposit aperture 655 being formed in the inlet solder deposit 410 that provides a hermetic coupling between the board inlet duct 615 and package fluid inlet duct 130. This change in shape also results in an outlet deposit aperture 660 being formed in the outlet solder deposit 415 that provides a hermetic coupling between the board outlet duct 620 and package fluid outlet duct 135. As will be apparent to a person skilled in the art, the heat transfer lid 305, in operation, facilitates dissipating heat generated by the semiconductor die 140.

Figure 7:
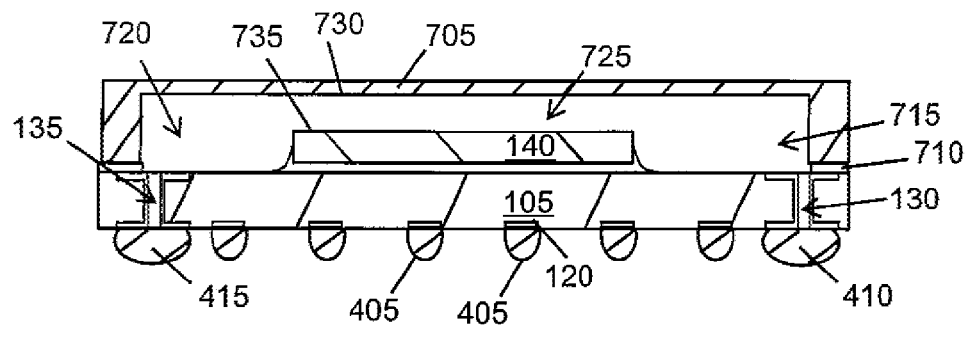
FIG. 7 is a cross-sectional side view of a fluid cooled semiconductor die package, in accordance with a second preferred embodiment of the present invention.

Referring to FIG. 7 there is illustrated a cross-sectional side view of a fluid cooled semiconductor die package 700, in accordance with a second preferred embodiment of the present invention. The package 700 is similar to the package 400 except that there is a different heat transfer lid 705 and gasket 710, and the epoxy resin 145 provides a liquid resistant protective barrier for the external terminals 150 of the semiconductor die 140. The heat transfer lid 705 covers, and encloses the semiconductor die 140 and in operation provides for fluid cooling of the die 140. The side walls of the heat transfer lid 705 and edges of semiconductor die 140 provide the lid inlet passage 715 and a lid outlet passage 720 that are in fluid communication, through a heat transfer chamber 725. Also a ceiling wall 730 of the heat transfer lid 705 and an upper or non-active surface 735 of the semiconductor die 140 forms the heat transfer chamber 725. Accordingly, the heat transfer lid 705, in operation, facilitates dissipation of heat generated by the semiconductor die 140.

Figure 8:
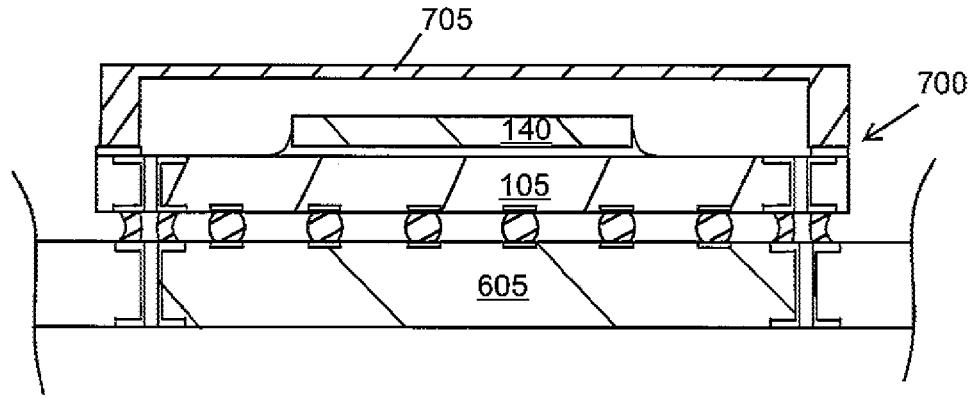
FIG. 8 is a cross-sectional side view of a fluid cooled circuit board system, in accordance with a third preferred embodiment of the present invention.

Referring to FIG. 8 there is illustrated a fluid cooled circuit board system 800, in accordance with a third preferred embodiment of the present invention. The system 800 is similar to the system 600 except that the fluid cooled semiconductor die package 400 has been replaced with the fluid cooled semiconductor die package 700.

Figure 9:
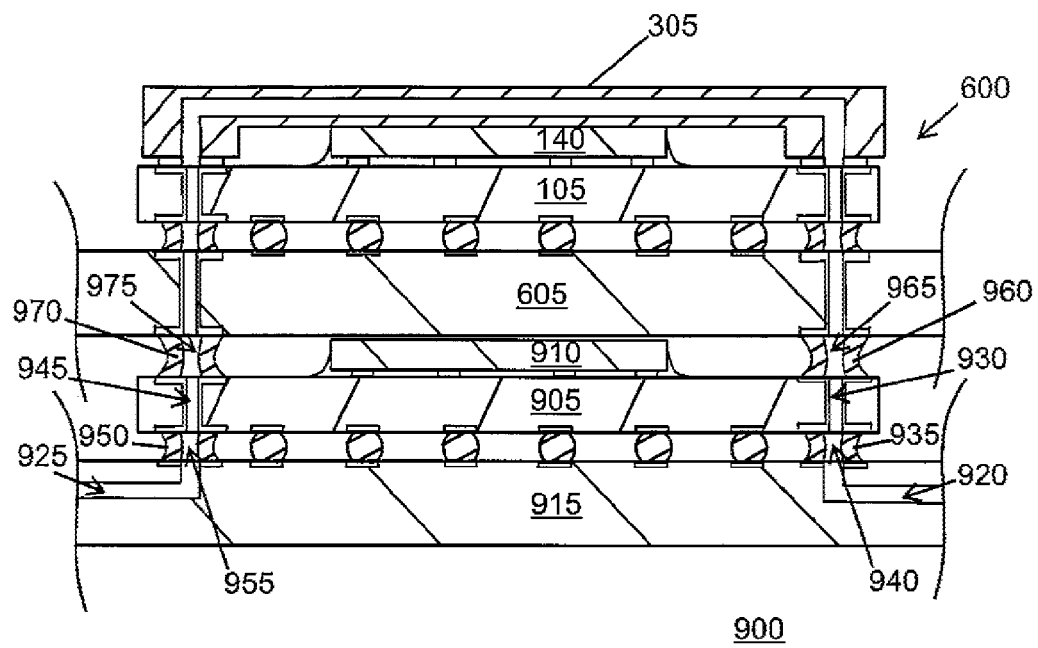
FIG. 9 is a cross-sectional side view of a stacked fluid cooled circuit board system, in accordance with a fourth preferred embodiment of the present invention.

Referring to FIG. 9 there is illustrated a cross-sectional side view of a stacked fluid cooled circuit board system 900, in accordance with a fourth preferred embodiment of the present invention. This stacked fluid cooled circuit board system 900 includes the system 600 in which the circuit board 605 is mounted (stacked) on an additional substrate 905 upon which is mounted an additional semiconductor die 910. The additional substrate 905 is mounted on an additional circuit board 915 that has an additional board fluid inlet duct 920 and additional board fluid outlet duct 925. The additional substrate 905 has an intermediate inlet fluid duct 930 with an associated solder deposit 935 with an aperture 940 that provides a hermetic coupling between the intermediate inlet fluid duct 930 and the additional board inlet fluid duct 920. The additional substrate 905 also has an intermediate outlet fluid duct 945 with an associated solder deposit 950 with an aperture 955 that provides a hermetic coupling between the intermediate outlet fluid duct 945 and the additional board outlet fluid duct 925.

The stacked fluid cooled circuit board system 900 also includes a coupling solder deposit 960 with a coupling aperture 965 that provides a hermetic coupling between the intermediate inlet fluid duct 930 and board inlet duct 615 of the circuit board 605. Similarly, there is also a coupling solder deposit 970 with a coupling aperture 975 that provides a hermetic coupling between the intermediate outlet fluid duct 945 and board outlet duct 620 of the circuit board 605.

Figure 10:
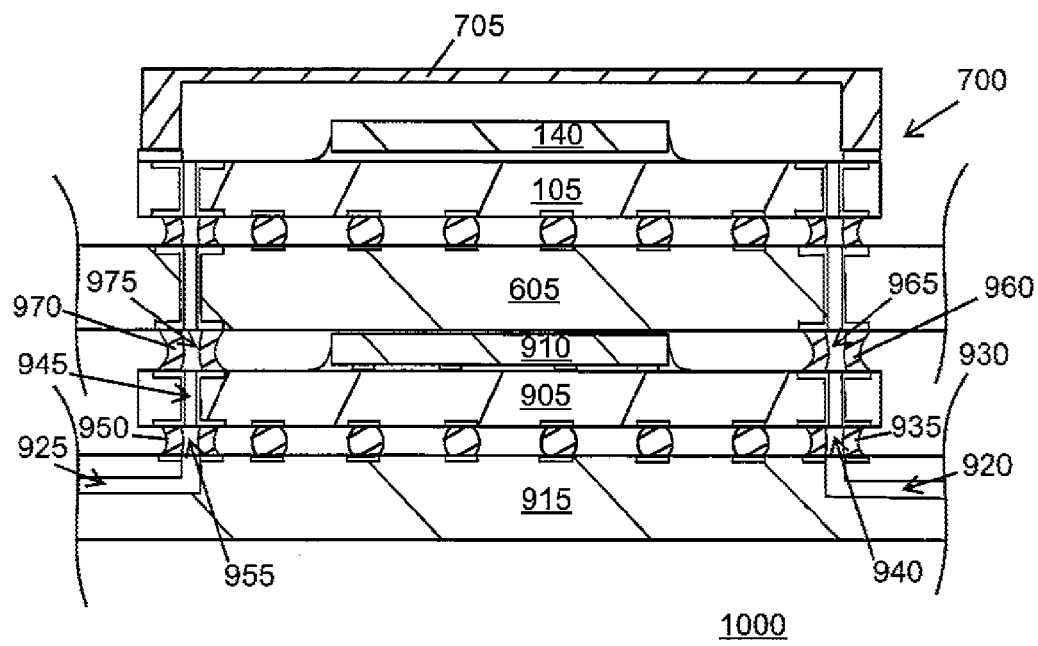
FIG. 10 is a cross-sectional side view of a stacked fluid cooled circuit board system, in accordance with a fifth preferred embodiment of the present invention.

Referring to FIG. 10 there is illustrated a cross-sectional side view of a stacked fluid cooled circuit board system 1000, in accordance with a fifth preferred embodiment of the present invention. The stacked fluid cooled circuit board system 1000 is similar to the stacked fluid cooled circuit board system 900 except that the components of system 600 have been replaced with the components of system 700.

Figure 11:
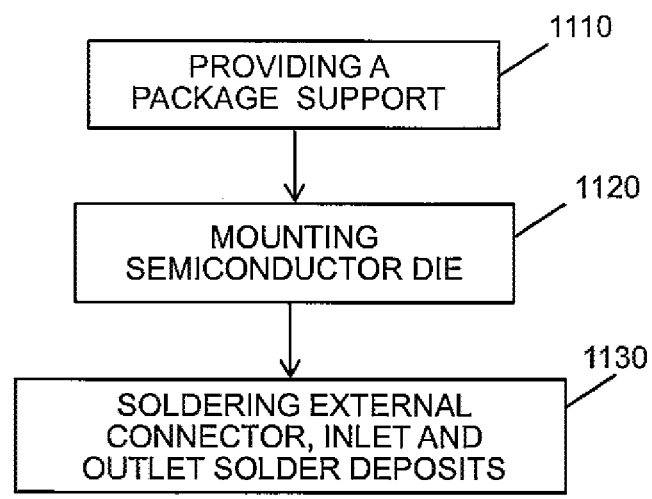
FIG. 11 is a flow chart of a method for manufacturing a fluid cooled semiconductor die package in accordance with a sixth preferred embodiment of the present invention.

Referring to FIG. 11, a flow chart of a method 1100 for manufacturing a fluid cooled semiconductor die package in accordance with a sixth preferred embodiment of the present invention is shown. By way of example only, the method 1100 will be described with reference to manufacturing the fluid cooled semiconductor die package 400. The method 1100, at a providing block 1110, includes providing the package support substrate 105 with a die mounting surface 110 with external connector pads 120 and an opposite package mounting surface 115. The package support substrate 105 has at least one package fluid inlet duct 130 and at least one package fluid outlet duct 135 each providing fluid communication between the die mounting surface 110 and package mounting surface 115.

The method 1100, at a mounting block 1120, performs a process of mounting the semiconductor die 140 on the die mounting surface 110. At a soldering block 1130, the method 1100 further performs a process of soldering the external connector solder deposits 405 to the external connector pads 120, an inlet solder deposit 410 to the inlet pad 340 that surrounds an entrance of the package fluid inlet duct 130, and the outlet solder deposit 415 to the outlet pad 360 that surrounds an exit of the package fluid inlet duct 135. Each of the external connector solder deposits 405 are formed from a single solder ball, the inlet solder deposit 410 is formed from a single solder ball that is the same size as the solder balls of a solder deposit 405. Alternatively, the inlet solder deposit 410 can be formed from at least two solder balls each being the same size as the solder balls of a solder deposit 405. Similarly, the outlet solder deposit 415 is formed from a single solder ball that is the same size as than the solder balls of a solder deposit 405. Alternatively, the outlet solder deposit 415 can be formed from at least two solder balls each being the same size as the solder balls of a solder deposit 405.

The method 1100 also includes a process of mounting the heat transfer lid 305 to the die mounting surface 110 and results in the manufacture of the fluid cooled semiconductor die package 400 or any other similar package as will be apparent to a person skilled in the art.

Figure 12:
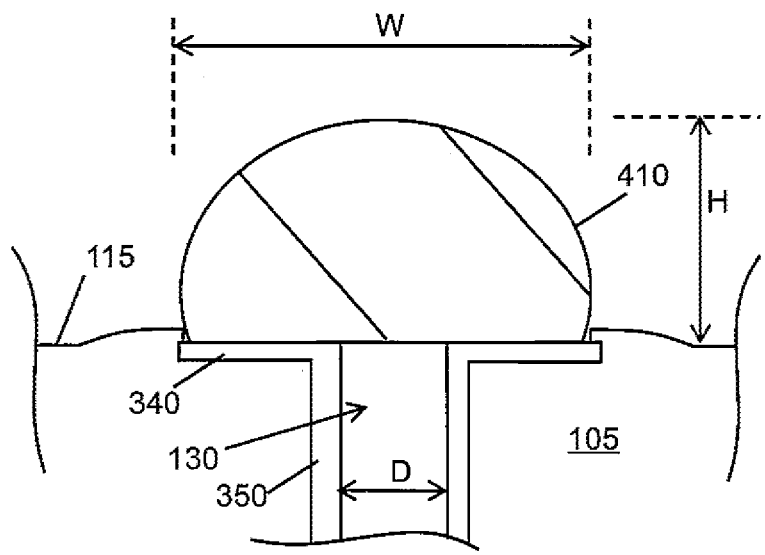
FIG. 12 is a cross-sectional side view of an inlet solder deposit on a package support substrate of the fluid cooled semiconductor die package of FIG. 4.

Referring to FIG. 12 there is illustrated a cross-sectional side view of an inlet solder deposit 410 on the package support substrate 105 of the fluid cooled semiconductor die package 400. As shown, the package support substrate 105 has been flipped over so that the package mounting surface 115 is above the die mounting surface 110. In this specific embodiment a suitable solder repelling deposit is applied to the inlet tube 350 to keep the solder from flowing into the package fluid inlet duct 130 during the soldering process. As shown, the inlet solder deposit 410 has a width W of 0.65 mm, a height H of 0.31 mm and the package fluid inlet duct 130 (the internal diameter of the inlet tube 350) has a diameter D of 0.3 m. Also, each of the two solder balls that form the solder deposit 410 has a diameter of 0.56 mm. When soldering the inlet solder deposit 410 to the inlet pad 340, the distance between the inlet pad 340 and the board inlet pad 625 is 0.27 mm. These dimensions provide one embodiment for obtaining the inlet deposit aperture 655 being formed in the inlet solder deposit 410. Similar dimensions can be used to obtain the outlet deposit aperture 660 and coupling apertures 965 and 975.

In operation a piped coolant or refrigerant is supplied to the board inlet duct 615 or 920 to cool the semiconductor die 140. The coolant or refrigerant then exits the fluid cooled circuit board system 600, 800, 900 or 1000 through the board outlet duct 620 or 925. Advantageously, the present invention provides for hermetically sealing one or more fluid coolant couplings by solder interconnects. These solder interconnects are formed as part of the ball grid array or grid array process and therefore may reduce costs or at least alleviate manufacturing complexity. Also the tubes, such as the tubes 350 and 370, improve the robustness and tensile strength of at least some of the hermetic seals and also these tubes provide a fluid seal to reduce the possibility of fluid coolants from seeping into the substrates and circuit boards.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A fluid cooled semiconductor die package, comprising:
a package support substrate with a die mounting surface and an opposite package mounting surface, the package support substrate having external connector solder deposits on respective external connector pads of the package mounting surface, wherein the package support substrate has at least one package fluid inlet duct and at least one package fluid outlet duct each providing fluid communication between the die mounting surface and the package mounting surface;
a semiconductor die mounted on the die mounting surface of the package support substrate, the semiconductor die having external terminals selectively electrically connected to the external connector pads;
an inlet solder deposit soldered to an inlet pad of the package mounting surface, wherein the inlet pad surrounds an entrance of the package fluid inlet duct; and
an outlet solder deposit soldered to an outlet pad of the package mounting surface, wherein the outlet pad surrounds an exit of the package fluid inlet duct, wherein each of the external connector solder deposits is formed from a single solder ball, and the inlet solder deposit is formed from at least one solder ball that is the same size as the single solder ball.

2. The fluid cooled semiconductor die package of claim 1, further comprising a lid mounted to the die mounting surface, wherein the lid has at least one heat transfer chamber therein that is hermetically coupled to the package fluid inlet duct and the package fluid outlet duct.

3. The fluid cooled semiconductor die package of claim 2, wherein the heat transfer chamber is formed from a surface of the semiconductor die and a wall of the lid.

4. The fluid cooled semiconductor die package of claim 3, wherein a wall of the heat transfer chamber abuts a surface of the semiconductor die.

5. The fluid cooled semiconductor die package of claim 2, wherein the lid has at least one lid inlet passage in fluid communication, through the heat transfer chamber, with at least one lid outlet passage, the lid inlet passage having a passage entrance hermetically coupled to the package fluid inlet duct and the lid outlet passage having a passage exit hermetically coupled to the package fluid outlet duct.

6. The fluid cooled semiconductor die package of claim 1, wherein the inlet pad is a metal-based annulus.

7. The fluid cooled semiconductor die package of claim 6, further including an annular inlet pad in the die mounting surface.

8. The fluid cooled semiconductor die package of claim 7, further including a metal based deposit on an inner surface of the package fluid inlet duct, the metal based deposit forming a tube coupling the inlet pad of the package mounting surface to the annular inlet pad.

9. The fluid cooled semiconductor die package of claim 6, wherein the inlet solder deposit is a solder globule that covers the entrance to the package fluid inlet duct.

10. The fluid cooled semiconductor die package of claim 1, wherein the external connector solder deposits form a ball grid array external connector arrangement.

11. A fluid cooled circuit board system, comprising:
 a circuit board with mounting pads thereon, the circuit board having a board inlet duct and a board outlet duct;
 a package support substrate with a die mounting surface and an opposite package mounting surface, the package support substrate having external connector solder deposits coupling between respective external connector pads of the package mounting surface and the mounting pads of the circuit board, wherein the package support substrate has at least one package fluid inlet duct and at least one package fluid outlet duct each providing fluid communication between the die mounting surface and package mounting surface;
 a semiconductor die mounted on the die mounting surface of the package support substrate, the semiconductor die having external terminals selectively electrically connected to the external connector pads;
 an inlet solder deposit coupling an inlet pad of the package mounting surface to an inlet pad of the circuit board, wherein the inlet pad of the package mounting surface surrounds an entrance of the package fluid inlet duct and the inlet pad of the circuit board surrounds an exit of the board inlet duct, and the inlet solder deposit has an inlet deposit aperture therein that provides a hermetic coupling between the board inlet duct and package fluid inlet duct; and
 an outlet solder deposit coupling an outlet pad of the package mounting surface to an outlet pad of the circuit board, wherein the outlet pad of the package mounting surface surrounds an exit of the package fluid outlet duct and an outlet pad of the circuit board surrounds an entrance of the board outlet duct, and the outlet solder deposit has an outlet deposit aperture therein that provides a hermetic coupling between the board outlet duct and package fluid outlet duct,
 wherein the circuit board is mounted on an additional substrate with an additional semiconductor die mounted thereon, the additional substrate being mounted on an additional circuit board that has an additional board inlet fluid duct and an additional board fluid outlet duct, the additional substrate having at least one intermediate inlet fluid duct with an associated solder deposit with an aperture therein that provides a hermetic coupling between the intermediate inlet fluid duct and the additional board inlet fluid duct.

12. The fluid cooled circuit board system of claim 11, further comprising is a lid mounted to the die mounting surface, the lid having at least one heat transfer chamber therein that is hermetically coupled to the package fluid inlet duct and package fluid outlet duct.

13. The fluid cooled circuit board system of claim 12, wherein the lid has at least one lid inlet passage in fluid communication, through the heat transfer chamber, with at least one lid outlet passage, the lid inlet passage having an passage entrance hermetically coupled to the package fluid inlet duct and the lid outlet passage having an passage exit hermetically coupled to the package fluid outlet duct.

14. The fluid cooled circuit board system of claim 11, further comprising a coupling solder deposit with a coupling aperture therein that provides a hermetic coupling between the intermediate inlet fluid duct and the board inlet duct of the circuit board.

15. A method for assembling a fluid cooled semiconductor die package, the method including:
 providing a package support substrate with a die mounting surface with external connector pads and an opposite package mounting surface, the package support substrate having at least one package fluid inlet duct and at least one package fluid outlet duct each providing fluid communication between the die mounting surface and package mounting surface;
 mounting a semiconductor die on the die mounting surface, the semiconductor die having external terminals that are selectively electrically connected to the external connector pads; and
 soldering external connector solder deposits to the external connector pads, an inlet solder deposit to an inlet pad that surrounds an entrance of the package fluid inlet duct, and an outlet solder deposit to an outlet pad that surrounds an exit of the package fluid inlet duct, wherein each of the external connector solder deposits is formed from a single solder ball, and the inlet solder deposit is formed from at least one solder ball that is the same size as the single solder ball.

16. The method of claim 15, further including mounting a lid to the die mounting surface, the lid having at least one heat transfer chamber therein that is hermetically coupled to the package fluid inlet duct and the package fluid outlet duct.

17. The method of claim 15, wherein the inlet solder deposit is a solder globule that covers the entrance to the package fluid inlet duct.

18. The method of claim 15, wherein the external connector solder deposits form a ball grid array external connector arrangement.

* * * * *